United States Patent [19]

Zwingman

[11] 4,195,261
[45] Mar. 25, 1980

[54] METHOD AND APPARATUS FOR MEASURING THE STRIPE WIDTH AND COLLAPSE FIELD OF MAGNETIC MATERIALS

[75] Inventor: Robert L. Zwingman, Poway, Calif.

[73] Assignee: Burroughs Corporation, Detroit, Mich.

[21] Appl. No.: 947,257

[22] Filed: Sep. 29, 1978

Related U.S. Application Data

[63] Continuation of Ser. No. 825,533, Aug. 18, 1977, abandoned.

[51] Int. Cl.$^2$ ............................................. G01R 33/00
[52] U.S. Cl. ................................... 324/210; 356/355; 365/10
[58] Field of Search .................... 324/210; 356/30, 32, 356/33, 35, 111, 115; 350/151; 365/1, 10

[56] References Cited

U.S. PATENT DOCUMENTS

| | | | |
|---|---|---|---|
| 3,752,563 | 8/1973 | Torok et al. | 350/151 |
| 3,831,156 | 8/1974 | Myer | 350/151 |

OTHER PUBLICATIONS

Henry, R. D., Bubble Material Characterization Using Spatial Filtering, Material Research Bull., vol. II, pp. 1285-1294, 1976.

*Primary Examiner*—Rudolph V. Rolinec
*Assistant Examiner*—Walter E. Snow
*Attorney, Agent, or Firm*—Joseph R. Dwyer; Kevin R. Peterson

[57] ABSTRACT

A method and an apparatus for characterizing magnetic materials especially LPE garnet films for magnetic bubble memory applications are described. The method and apparatus comprises in the first embodiment passing monochromatic linearly polarized light through a magnetic film, under no applied external field (Ha=0) with a randomly oriented stripe domain structure to produce a single diffraction grating, then (1) the angle of the first order diffracted beam is deduced by directly comparing the currents produced by a linear position photodetector and an ordinary intensity photodetector and (2) next a magnetic field (Ha) is applied normal to the surface of the film and the field is increased until intensity of the second order diffraction beam is maximized. In the second embodiment of the method so that higher signals can be detected for the first order diffracted beam, the film is magnetized so that the stripe domain configuration is parallel and the foregoing steps followed.

The angle of the first order diffracted beam relates to the stripe width of the magnetic film under no applied external magnetic field. The magnetic field which corresponds to the intensity maximum of the second order diffracted beam is the field, $H_{0.5}$, which magnetizes the film to $M=0.5 \times M_s$, where M is the net magnetization of the film and $M_s$ is the saturation magnetization. The stripe width at Ha=0 and the field $H_{0.5}$ determine the diameter of the magnetic bubble domain that the film will support and the magnetic field necessary for bubble collapse. The apparatus for carrying out the foregoing method is all solid state and needs no mechanical feedback or mechanical adjustments.

7 Claims, 1 Drawing Figure

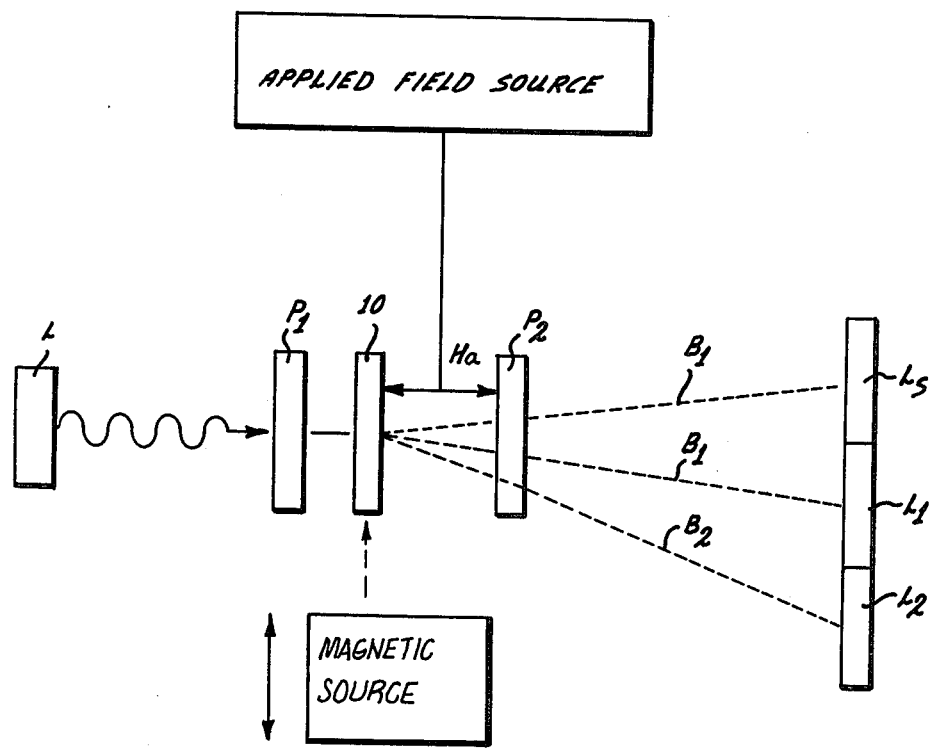

METHOD AND APPARATUS FOR MEASURING THE STRIPE WIDTH AND COLLAPSE FIELD OF MAGNETIC MATERIALS

This is a continuation of application Ser. No. 825,533, filed Aug. 18, 1977, now abandoned.

BACKGROUND OF THE INVENTION

1. Field of the Invention

This invention relates to the characterization of magnetic materials and, in particular, to a method and apparatus for measuring certain parameters of an epitaxial magnetic garnet films.

More specifically, this invention relates to a determination of the stripe width and collapse field so that taken together with the film thickness, the properties of the magnetic material can be deduced. This is particularly useful in characterizing magnetic films for magnetic domain memory chips.

2. Description of the Prior Art

The characterization of static magnetic properties of bubble materials of a known composition can be made by determining three parameters of the material; the film thickness, the stripe width and the collapse field. With these three parameters, calculations can be made of the film magnetization, anisotropy, exchange constant, Neel temperature and the Q of the film. There are two main prior art techniques used to determine the stripe width and collapse field. One technique is to use polarization microscopy to directly measure the stripe widths and then apply a magnetic field to the garnet film to see at what field a magnetic bubble collapses. This method is direct but it is also time consuming and, thus, uneconomical. Also, polarization microscopy becomes less feasible as bubble diameters approach submicron dimensions because the diameters of collapsing bubbles approaches the diffraction limit of the microscope. Also, as bubble domains become smaller, the film becomes correspondingly thinner and the Faraday rotation and the resulting contrast decrease accordingly.

Another technique for measuring the stripe width and collapse field is a so-called "spatial filtering" technique and is described by R. D. Henry in an article, *Bubble Material Characterization Using Spatial Filtering*, Material Research Bulletin, Vol. II, pp. 1285-1294, 1976, Pergamon Press, Inc. In this technique, a polarized laser beam is directed thru a film. The film has a random orientation of the stripe domains. A diffraction pattern of the randomly oriented domains produces a conical type diffraction pattern. Then, at bias field (Ha=0) a spatial filter of an annular pass-ring configuration is moved back and forth to obtain maximum intensity of the first order diffracted light which is focused by a lens onto a photomultiplier or detector. The photomultiplier or detector produces a current as a function of light intensity. The first order diffraction angle is used to obtain the stripe width, then, the spatial filter is moved a calculated distance toward the film so that the spatial filter will pass only the second order diffraction beam. Then Ha is adjusted to maximize the current detected by the photomultiplier. The collapse field is calculated from this value of current and the stripe width.

The disadvantages to this latter prior art method are, first, one needs the sliding spatial filter to eliminate stray light and to maximize the signal of the diffracted beams and, second, calculations are necessary to determine where to locate the spatial filter for the second order diffraction test—all of which are time consuming even with the benefit of a calculator. Finally, a condensing lens is required to focus the diffracted beam onto the detector since detectors usually aren't large enough to absorb the total diffracted beam.

Accordingly, it is an object of this invention to provide a method and apparatus for characterizing magnetic material which overcomes the deficiencies of the prior art system by eliminating the spatial filter, all mechanical feedback and mechanical adjustments.

SUMMARY OF THE INVENTION

The method for characterizing magnetic material which accomplishes the foregoing object and overcomes the deficiencies of the prior art is disclosed as two embodiments. In the first embodiment the magnetic film stripe domains are randomly oriented (serpentine) and the second embodiment the stripes are first aligned in parallel. Thus, the method comprises, in the first embodiment, steps of, first, passing a polarized light through the film at Ha=0 to produce a simple grating effect defraction in the form of conical beams, measuring the intensity of the first order diffracted beam, comparing the intensity with the output of a linear position photodetector and determining the angle of diffraction. Second, applying a magnetic field to the film until maximum intensity is reached for the second order diffracted beam and measuring the resulting magnetic field, Ha $(M=0.5 \times M_s)$. The apparatus which carries out the foregoing method comprises a monochromatic source of light such as a laser which is directed through a polarizer onto and thru the film which, in turn, diffracts the light from the film through a second polarizer onto a linear position spot photodetector and onto two separate spot intensity photodetectors. The first order diffracted beam strikes the linear position spot detector and only one of the intensity spot detectors. The second order diffracted beam only strikes the other intensity spot detector. The currents from the linear position spot detector and one of the spot intensity detectors determine the angle of first order diffracted beam. The current from the other spot intensity detector determines the intensity of the second order diffracted beam. Thus, the stripe width is determined from the first order diffraction angle data.

The collapse field is calculated from the stripe width data and the field Ha=Ha $(M=0.5 \times M_s)$, which was determined from the maximization of the intensity of the second order diffracted beam.

In the second embodiment the intensity of the diffracted beams which strike the photodetectors can be enhanced by aligning the stripe domains in a parallel configuration such that the diffracted beams are more collimated. The steps of the method are carried as above described.

BRIEF DESCRIPTION OF THE DRAWING

The sole FIGURE herein shows schematically the characterization apparatus for determining the parameters of a thin magnetic film for magnetic bubble memories.

BRIEF DESCRIPTION OF THE PREFERRED EMBODIMENT

Now with reference to the drawing, a magnetic film is placed between two polarizers P1 and P2 to receive light directed therethough from a source radiant energy such as a laser L. The film 10 may have the stripe domains randomly oriented, i.e., serpentine, or preferably film 10 may be premagnetized to form aligned stripe domains thereon to produce maximum intensity collimated beams of the first and second order diffraction for measurement. The polarized light from polarizer P1 directed through the film diffracts the light by Faraday rotation. The first and second order diffracted beams are labeled B1 and B2 respectively. The light beams are directed through a crossed polarizer P2. Means in the form of a linear position spot photodetector LS transforms the position of the beam B1 into a current proportional to the beam position. Means in the form of similar spot intensity photodetectors L1 and L2 are positioned below but in alignment with detector LS. Detectors L1 and L2 produce currents porportional to the intensity of the beam striking them. In the embodiment shown, L1 is utilized to measure the intensity of the first order diffraction beam B1. With the information derived from detectors LS and L1 one can calculate the diffraction angle and relate this information to stripe width directly. Since the output of the linear position detector LS is a function of the position of the beam (spot) as it strikes the detector, this output together with the output of detector LI serves a direct reading of diffraction angle and since it is well known in the art that the diffraction angle is a function of stripe width, the stripe width is thus known from the output of the detector.

Thereafter, an applied magnetic field Ha directed normal to the film will enable detector L2 to measure the intensity of the second order diffraction. The intensity of the applied magnetic field is varied until the maximum intensity of the second order diffraction is reached. The maximum is reached at stripe widths corresponding to a film magnetization $M = 0.5 \times M_s$. The field needed to maximize the intensity of the second order diffraction beam is used with the stripe width at Ha=0 to determine the bubble collapse field, $H_{col}$.

By way of example only, the laser for this invention may be a HeNe Laser System Model No. HP 3093 H available from Hughes Aircraft Co., Carlsbad, CA., the linear spot detector, LS, and the intensity detectors, L1 and L2, are available from United Detector Technology, Inc. of Santa Monica, CA., Stock Nos. 10-05-004 and 10-04-001, respectively.

From the foregoing it can be seen that with the discovery that the randomly oriented stripe domain on a thin film produces a pair of conical beams the intensity of which can be measured and if the stripe domains are parallely oriented, the intensity of the collimated beams is considerably higher than the intensity of the diffraction pattern produced by randomly oriented stripes and importantly that in either case a simple solid state apparatus such as disclosed can characterize magnetic said thin films without mechanical adjustments and mechanical feedback.

What is claimed is:

1. A method for measuring certain parameters of a thin film magnetic material having stripe domains thereon especially adaptable for magnetic bubble memories, comprising the steps of:
   subjecting the thin film magnetic material to a magnetic field to align the stripe domains in parallel,
   removing the magnetic field used to align the stripe domains while maintaining the magnetic field necessary to maintain the domains in stripe form and subjecting the parallel magnetic stripe domains to a source of polarized light to form a first and second order of diffracted beams of light,
   measuring the intensity of the first order of diffracted beam of light and the angle of diffraction of said first order beam of light to determine stripe width.

2. The method as claimed in claim 1 including the further step of:
   subjecting the film to a second magnetic field normal to the plane of the film to reduce the stripe width until the maximum intensity of the second order diffraction beam of light is reached and measuring the magnetic field necessary to accomplish this reduction which together with the determined stripe width the magnetic bubble collapse field of the film can be determined.

3. A method as claimed in claim 2 wherein the intensity of said second order diffraction is related to the applied magnetic field at the stripe width corresponding to a net magnetization of one-half of saturation magnetization.

4. An apparatus for measuring certain parameters of a thin film magnetic material having stripe domains thereon especially adaptable for magnetic bubble memories comprising:
   a source of radiant monochromatic light,
   a first polarizer and a second polarizer disposed in parallel to each other with the thin film disposed therebetween, said source directing polarized light through the thin film and such polarizers to form first and second order diffracted beams of light from said thin film,
   a first means also aligned in a plane parallel to said film and polarizers for receiving said first order beam of light and emitting a current proportional to the position of the first order beam of received light,
   a second means also aligned in a plane parallel to said film and polarizers for receiving said first order beam of light and emitting a current proportional to the intensity of the first order beam of received light,
   whereby the currents emitted from said first and second means together are a measure of the stripe width.

5. The apparatus of claim 4 wherein said first means comprises a linear photodetector parallel to the film whose output is proportional to the position of the diffracted first order beam incident on said photodetector and said second means comprises an intensity photodetector.

6. The apparatus of claim 5 further including means for applying a magnetic field normal to the film until the maximum intensity of the second order beam is detected and additional means for measuring the intensity of the second order diffraction beam of light whereby in conjunction with stripe width the bubble collapse field may be determined.

7. The apparatus as claimed in claim 6 wherein said additional means comprises an intensity photodetector which emits a current proportional to the intensity of a beam of light received by it.

* * * * *